(12) United States Patent
Shin

(10) Patent No.: US 8,483,005 B2
(45) Date of Patent: Jul. 9, 2013

(54) INTERNAL SIGNAL GENERATOR FOR USE IN SEMICONDUCTOR MEMORY DEVICE

(75) Inventor: Beom-Ju Shin, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 1335 days.

(21) Appl. No.: 11/477,540

(22) Filed: Jun. 30, 2006

(65) Prior Publication Data
US 2007/0070677 A1    Mar. 29, 2007

(30) Foreign Application Priority Data

Sep. 29, 2005 (KR) .......................... 10-2005-0090891
Dec. 29, 2005 (KR) .......................... 10-2005-0134002

(51) Int. Cl.
*G11C 8/18* (2006.01)
*G11C 8/04* (2006.01)

(52) U.S. Cl.
USPC .. 365/230.08; 365/191; 365/194; 365/233.13

(58) Field of Classification Search
USPC .................. 365/191, 222, 223, 194, 230.08, 365/233.13
See application file for complete search history.

(56) References Cited

U.S. PATENT DOCUMENTS

| | | | | |
|---|---|---|---|---|
| 5,337,168 A * | 8/1994 | Fujii et al. ...................... | 358/539 |
| 5,463,635 A | 10/1995 | Kumazawa et al. | |
| 5,767,718 A * | 6/1998 | Shih .............................. | 327/228 |
| 5,787,045 A | 7/1998 | Lee | |
| 6,134,180 A | 10/2000 | Kim et al. | |
| 6,366,515 B2 * | 4/2002 | Hidaka ......................... | 365/200 |
| 6,711,084 B2 * | 3/2004 | Ishida et al. .................. | 365/226 |
| 2003/0031082 A1 * | 2/2003 | Sawada ......................... | 365/233 |
| 2005/0024116 A1 * | 2/2005 | Florescu ....................... | 327/250 |
| 2005/0105363 A1 | 5/2005 | Ko | |
| 2005/0122795 A1 * | 6/2005 | Fujisawa et al. .............. | 365/191 |

FOREIGN PATENT DOCUMENTS

| | | |
|---|---|---|
| JP | 2000-57777 A | 2/2000 |
| JP | 2000-202142 | 1/2002 |
| JP | 2006-139879 | 6/2006 |
| JP | 2006-309913 | 11/2006 |
| JP | 2006-309915 | 11/2006 |
| JP | 2007-095257 | 4/2007 |
| KR | 10-2002-0001968 | 1/2001 |
| TW | 577089 | 2/2004 |

OTHER PUBLICATIONS

R. Jacob Baker, CMOS Circuit Design, Layout, and Simulation, 2005, John Wiley & Sons Inc., pp. 386-388.*
Korean Patent Gazette issued in Korean Patent Application No. KR 10 2005-0134002 dated on Jan. 17, 2007.
Notice of Allowance issued by the Japanese Patent Office on Feb. 8, 2012.

* cited by examiner

*Primary Examiner* — Hoai V Ho
*Assistant Examiner* — Jay Radke
(74) *Attorney, Agent, or Firm* — IP & T Group LLP

(57) ABSTRACT

A semiconductor memory device includes a pipe latch unit having a plurality of pipe latches, each of which latches an external address in response to the activation of an external command and outputs an internal address in response to the activation of an internal command corresponding to the external command. A pipe latch control unit is configured to control the pipe latch unit to sequentially enable the plurality of pipe latches. An output drive unit is configured to selectively output the internal address or the external address. The internal command is activated after a predetermined latency from an activation timing of the external command.

34 Claims, 15 Drawing Sheets

INTERNAL SIGNAL GENERATOR FOR USE IN SEMICONDUCTOR MEMORY DEVICE

FIELD OF THE INVENTION

The present invention relates to a semiconductor memory device, and more particularly to an internal signal generator for use in a semiconductor memory device for reducing current consumption.

DESCRIPTION OF RELATED ARTS

Semiconductor memory devices typically receive an external column command such as an external read command or an external write command after an active command is input and operations in response to the active command are then completed. Hereinafter, delay between an input of the active command and an input of the external column command is referred to as tRCD. An address input with the external column command is input after tRCD. However, it is possible for a semiconductor memory device such as a DDR2 SDRAM to set input timing of the external column command even before tRCD. The semiconductor memory device holds the external column command input before tRCD for a predetermined time and generates an internal column command, such as an internal read command or an internal write command, corresponding to the external column command after tRCD passes from the timing of the active command. The predetermined time between an input of the external column command and generation of the internal column command is referred to as additive latency (AL). An external address input with the external column command is also held for the additive latency (AL) and, then, an internal address corresponding to the external address is generated.

FIG. 1 is a timing diagram for a read operation of a semiconductor memory device.

In order to perform a read operation, a semiconductor memory device such as DDR2 SDRAM generates an internal read address RD_IADD and an internal read command IRD after the additive latency AL passes from the input timing of an external read command RD and an external address EXT_ADDR. After a predetermined time from generation of the internal read command IRD and the internal read address RD_IADD, the semiconductor memory device starts to read a valid data D0 to D3. The predetermined time between the generation of the internal read command IRD and the internal address RD_IADD and start of the read operation is referred to as column address strobe (CAS) latency CL. The semiconductor memory device starts to perform the read operation after the additive latency AL and the CAS latency CL from the input timing of the read command and the address. A value obtained by adding the CAS latency CL to the additive latency AL is referred as a read latency RL.

FIG. 2 is a timing diagram for a write operation of the semiconductor memory device.

In the case of a write operation, the semiconductor memory device generates an internal write command IWT and an internal write address WT_IADD and performs the write operation after a write latency WL from an input timing of a write command WT and an external address EXT_ADDR. The write latency WL is less by one clock than the read latency RL. That is, WL=RL−1=(AL+CL)−1.

FIG. 3 is a block diagram of a conventional internal signal generator of semiconductor memory device.

The internal signal generator can be commonly used to generate an internal address and an internal command. That is, the internal signal generator is respectively provided for every bit of the external address EXT_ADDR, the read and the write commands, and a bank address. In FIG. 3, the internal signal generator is used for generating an internal column address.

The internal signal generator includes a read address generation unit 10, a write address generation unit 20, and an output unit 30. The read address generation unit 10 delays an external address EXT_ADDR in response to a clock signal CLK and outputs an internal read address RD_IADD corresponding to an additive latency of the semiconductor memory device. The write address generation unit 20 delays the internal read address RD_IADD in response to the clock signal CLK and outputs an internal write address WT_IADD corresponding to a write latency of the semiconductor memory device. The output unit 30 selects one of the internal read address RD_IADD and the internal write address WT_IADD in response to a write state signal WTS to thereby output an internal column address CA. The write state signal WTS is active during a write operation.

The read address generation unit 10 includes an additive latency delay unit 12 and a first selection unit 14. The additive latency delay unit 12 generates a plurality of additive addresses by delaying the external address EXT_ADDR in response to the clock signal CLK. The first selection unit 14 selects one of the additive addresses corresponding to the additive latency of the semiconductor memory device and outputs the selected one as the internal read address RD_IADD. The write address generation unit 20 includes a CAS latency delay unit 22 and a second selection unit 24. The CAS latency delay unit 22 generates a plurality of CAS addresses by delaying the internal read address RD_IADD in response to the clock signal CLK. The second selection unit 24 selects one of the CAS addresses corresponding to the CAS latency of the semiconductor memory device and outputs the selected one as the internal write address WT_IADD.

The additive latency delay unit 12 includes a plurality of flip-flops connected one another in series. The CAS latency delay unit 22 also includes a plurality of flip-flops connected one another in series. The number of flip-flops included in the additive latency delay unit 12 and the CAS latency delay unit 22 correspond to a maximum additive latency and a maximum CAS latency. When the maximum additive latency is six clocks and the maximum CAS latency is seven clocks, one internal signal generator includes thirteen flip-flops. As abovementioned, because the internal signal generator is provided for every bit of the external address EXT_ADDR, the read and the write commands, and the bank address, hundreds of flip-flops are required for the semiconductor memory device. Accordingly, the semiconductor memory device consumes a large amount of current and the size of the semiconductor memory device is increased. Further, when the additive latency and the CAS latency set by the semiconductor memory device is different from the maximum additive latency and the maximum CAS latency, it is not necessary that every flip-flop included in the additive latency delay unit 12 and the CAS latency delay unit 22 perform a latch operation. Nevertheless, every flip-flop included in the additive latency delay unit 12 and the CAS latency delay unit 22 performs the latch operation irrespective of the additive latency and the CAS latency. Thus, the internal signal generator shown in FIG. 3 causes unnecessary current consumption.

SUMMARY OF THE INVENTION

A semiconductor memory device includes an internal signal generator for reducing current consumption and chip size.

In accordance with an aspect of the present invention, a semiconductor memory device includes a pipe latch unit having a plurality of pipe latches, each of which latches an external address in response to an activation of an external command and outputs an internal address in response to an activation of an internal command corresponding to the external command. A pipe latch control unit is configured to control the pipe latch unit to sequentially enable the plurality of pipe latches. An output drive unit is configured to selectively output the internal address or the external address. The internal command is activated after a predetermined latency from an activation of the corresponding external command.

In accordance with another aspect of the present invention there is provided a method for generating an internal address for use in a semiconductor memory device, including latching an external address in a pipe latch in response to an input of an external command; generating an internal command by delaying the external command according to a predetermined latency, and outputting the latched external address as the internal address in response to an activation of the internal command.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device in accordance with the present invention will be described in detail referring to the accompanying drawings.

Figure 4:
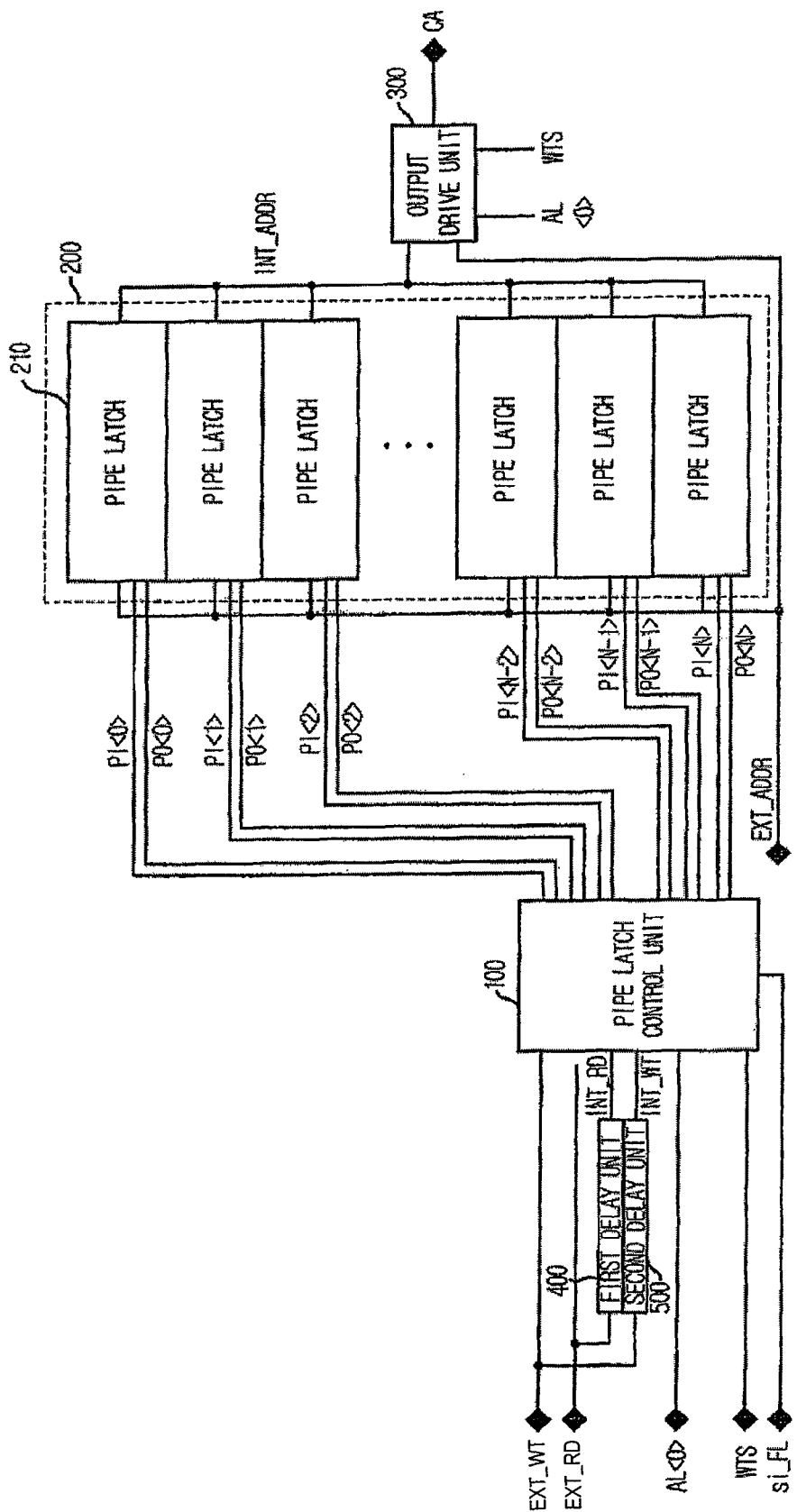
FIG. 4 is a block diagram of an internal signal generator for use in a semiconductor memory device in accordance with an embodiment of the present invention.

FIG. 4 is a block diagram of an internal signal generator for use in a semiconductor memory device in accordance with an embodiment of the present invention.

The internal signal generator includes a pipe latch control unit 100, a pipe latch unit 200, and an output drive unit 300. The pipe latch control unit 100 sequentially enables a pipe input signal PI<0:N> at every input of an external read command EXT_RD or an external write command EXT_WT. The pipe latch control unit 100, also, sequentially enables a pipe output signal PO<0:N> at every input of an internal read command INT_RD or an internal write command INT_WT. The pipe latch unit 200 includes a plurality of pipe latches, e.g., a first pipe latch 210, each of which latches an external address EXT_ADDR in response to a corresponding pipe input signal PI<0:N> and outputs the latched address as an internal address INT_ADDR in response to a corresponding pipe output signal PO<0:N>. The output drive unit 300 selectively outputs one of the internal address INT_ADDR and the external address EXT_ADDR in response to a zero additive latency signal AL<0> and a write state signal WTS. The zero additive latency signal AL<0> is active when an additive latency of the semiconductor memory device is set to zero clocks. The write state signal WTS is active during a write operation.

The internal signal generator further includes a first and a second delay unit 400 and 500. The first delay unit 400 delays the external read command EXT_RD and outputs the internal read command INT_RD corresponding to the additive latency of the semiconductor memory device. The second delay unit 500 delays the external write command EXT_WT and outputs the internal write command INT_WT corresponding to the write latency of the semiconductor memory device. In one embodiment of the present invention, the first and the second delay units 400 and 500 can be respectively implemented with circuits similar to the read address generation unit 10 and the write address generation unit 20.

Figure 5:
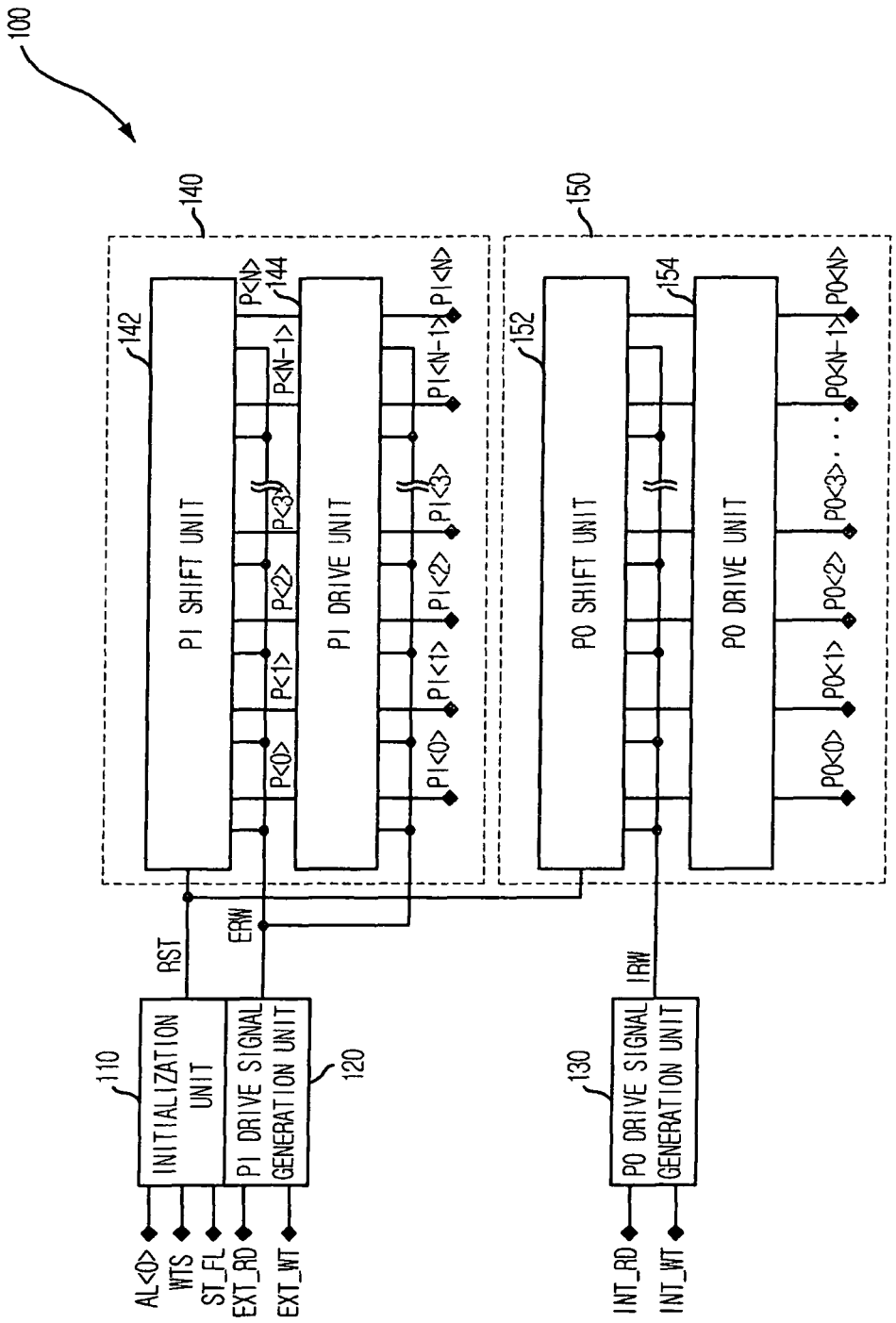
FIG. 5 is a block diagram of a pipe latch control unit shown in FIG. 4.

FIG. 5 is a block diagram of the pipe latch control unit 100 shown in FIG. 4.

The pipe latch control unit 100 includes an initialization unit 110, a pipe in (PI) drive signal generation unit 120, a pipe output (PO) drive signal generation unit 130, a pipe in (PI) signal generation unit 140, and a pipe output (PO) signal generation unit 150.

The initialization unit 110 generates a reset signal RST for initializing the PI signal generation unit 140 and the PO signal generation unit 150 in response to the zero additive latency signal AL<0>, the write state signal WTS, and an initial reset signal ST_FL. The initial reset signal ST_FL resets the PI signal generation unit 140 and the PO signal generation unit 150 at initial operation time of the semiconductor memory device in order to seek a reliable operation. The PI drive signal generation unit 120 enables a pipe in (PI) drive signal ERW when the external read command EXT_RD or the external write command EXT_WT is active. The PO drive signal generation unit 130 enables a pipe out (PO) drive signal IRW when the internal read command INT_RD or the internal write command INT_WT is active. The PI signal generation unit 140 activates one of the pipe in signals PI<0:N> corresponding to the PI drive signal ERW. The PO signal generation unit 150 activates one of the pipe output signals PO<0:N> corresponding to the PO drive signal IRW. That is, the PI signal generation unit 140 outputs the pipe in signal PI<0:N> one by one at every input of the external read command EXT_RD or the external write command EXT_WT. Similarly, the PO signal generation unit 150 outputs the pipe output signal PO<0:N> one by one at every input of the internal read command INT_RD or the internal write command INT_WT.

The PI signal generation unit 140 includes a pipe in (PI) shift unit 142 and a pipe in (PI) drive unit 144. The PI shift unit 142 sequentially generates a plurality of pipe in (PI) delay signals P<0:N> in synchronism with the PI drive signal ERW. In other words, the PI delay signals P<0:N> are output one by one at every input of the external read command EXT_RD or the external write command EXT_WT. The PI drive unit 144 receiving the PI delay signals P<0:N> and the PI drive signal ERW sequentially drives the pipe in signal PI<0:N>. The PO signal generation unit 150 includes a pipe out (PO) shift unit 152 and a pipe out (PO) drive unit 154. The PO shift unit 152 sequentially generates a plurality of pipe out (PO) delay signals in synchronism with the PO drive signal IRW. In other words, the PO delay signals are output one by one at every input of the internal read command INT_RD or the internal write command INT_WT. The PO drive unit 154 receiving the PO delay signals sequentially drives the pipe output signal PO<O:N>.

Figure 6A:
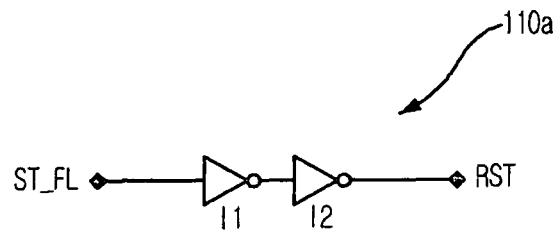
FIG. 6A is a schematic circuit diagram of an initialization unit shown in FIG. 5 in accordance with an embodiment of the present invention.

FIG. 6A is a schematic circuit diagram of the initialization unit shown in FIG. 5 in accordance with an embodiment of the present invention.

The initialization unit 110a, provided with two inverters I1 and I2, outputs the initial reset signal ST_FL as the reset signal RST. The initialization unit 110a enables the reset signal RST when the initial reset signal ST_FL is active.

Figure 6B:
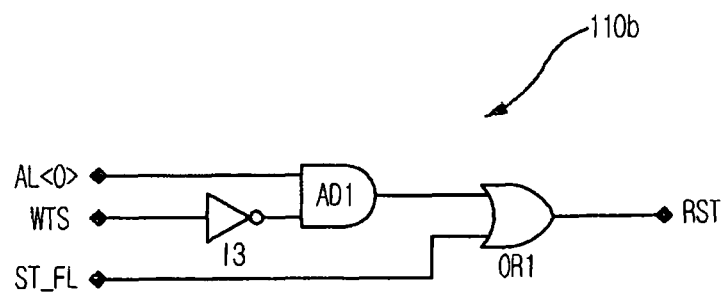
FIG. 6B is a schematic circuit diagram of an initialization unit shown in FIG. 5 in accordance with another embodiment of the present invention.

FIG. 6B is a schematic circuit diagram of the initialization unit shown in FIG. 5 in accordance with another embodiment of the present invention.

The initialization unit 110b includes a third inverter I3, a first AND gate AD1, and a first OR gate OR1. The third inverter I3 inverts the write state signal WTS. The first AND gate AD1 logically combines the inverted write state signal WTS and the zero additive latency signal AL<0>. The first OR gate OR1 logically combines an output of the first AND gate AD1 and the initial reset signal ST_FL. The initialization unit 110b enables the reset signal RST when the zero additive latency signal AL<0> is active and the write state signal is inactive. The initialization unit 110b enables the reset signal RST when the initial reset signal is active. That is, the reset signal RST output from the initialization unit 110b is active when the additive latency of the semiconductor memory device is zero clocks and the semiconductor memory device performs the read operation.

Figure 6C:
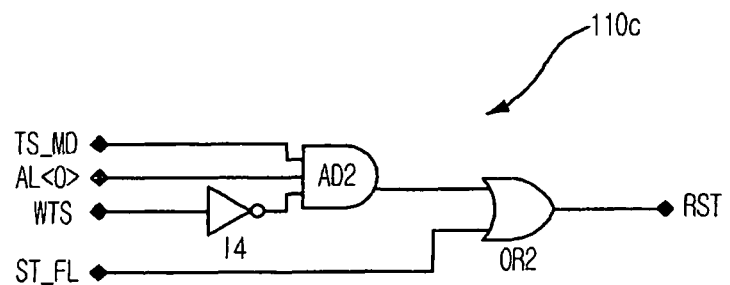
FIG. 6C is a schematic circuit diagram of an initialization unit shown in FIG. 5 in accordance with still another embodiment of the present invention.

FIG. 6C is a schematic circuit diagram of the initialization unit shown in FIG. 5 in accordance with still another embodiment of the present invention.

The initialization unit 110c includes a fourth inverter I4, a second AND gate AD2, and a second OR gate OR2. The fourth inverter I4 inverts the write state signal WTS. The second AND gate AD2 logically combines the inverted write state signal WTS, the zero additive latency signal AL<0>, and a test mode signal TS_MD. The test mode signal TS_MD is active during a test mode. The second OR gate OR2 logically combines an output of the second AND gate AD2 and the initial reset signal ST_FL. The initialization unit 110c enables the reset signal RST when the test mode signal TS_MD is active, the zero additive latency signal AL<0> is active, and the write sate signal WTS is inactive.

Figure 7:
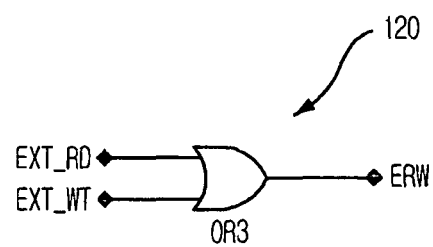
FIG. 7 is a schematic circuit diagram of a PI drive signal generation unit shown in FIG. 5.

FIG. 7 is a schematic circuit diagram of the PI drive signal generation unit 120 shown in FIG. 5.

The PI drive signal generation unit 120 includes a third OR gate OR3 logically combining the external read command EXT_RD and the external write command EXT_WT. The PI drive signal generation unit 120 enables the PI drive signal ERW when the external read command EXT_RD is active or the external write command EXT_WT is active.

Figure 8:
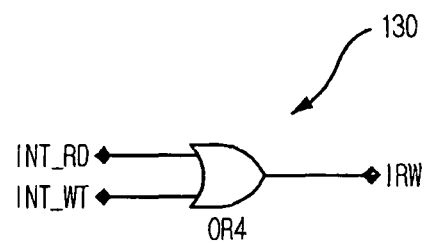
FIG. 8 is a schematic circuit diagram of a PO drive signal generation unit shown in FIG. 5.

FIG. 8 is a schematic circuit diagram of the PO drive signal generation unit 130 shown in FIG. 5.

The PO drive signal generation unit 130 includes a fourth OR gate OR4 logically combining the internal read command INT_RD and the internal write command INT_WT. The PO drive signal generation unit 130 enables the PO drive signal IRW when the internal read command INT_RD is active or the internal write command INT_WT is active.

Figure 9:
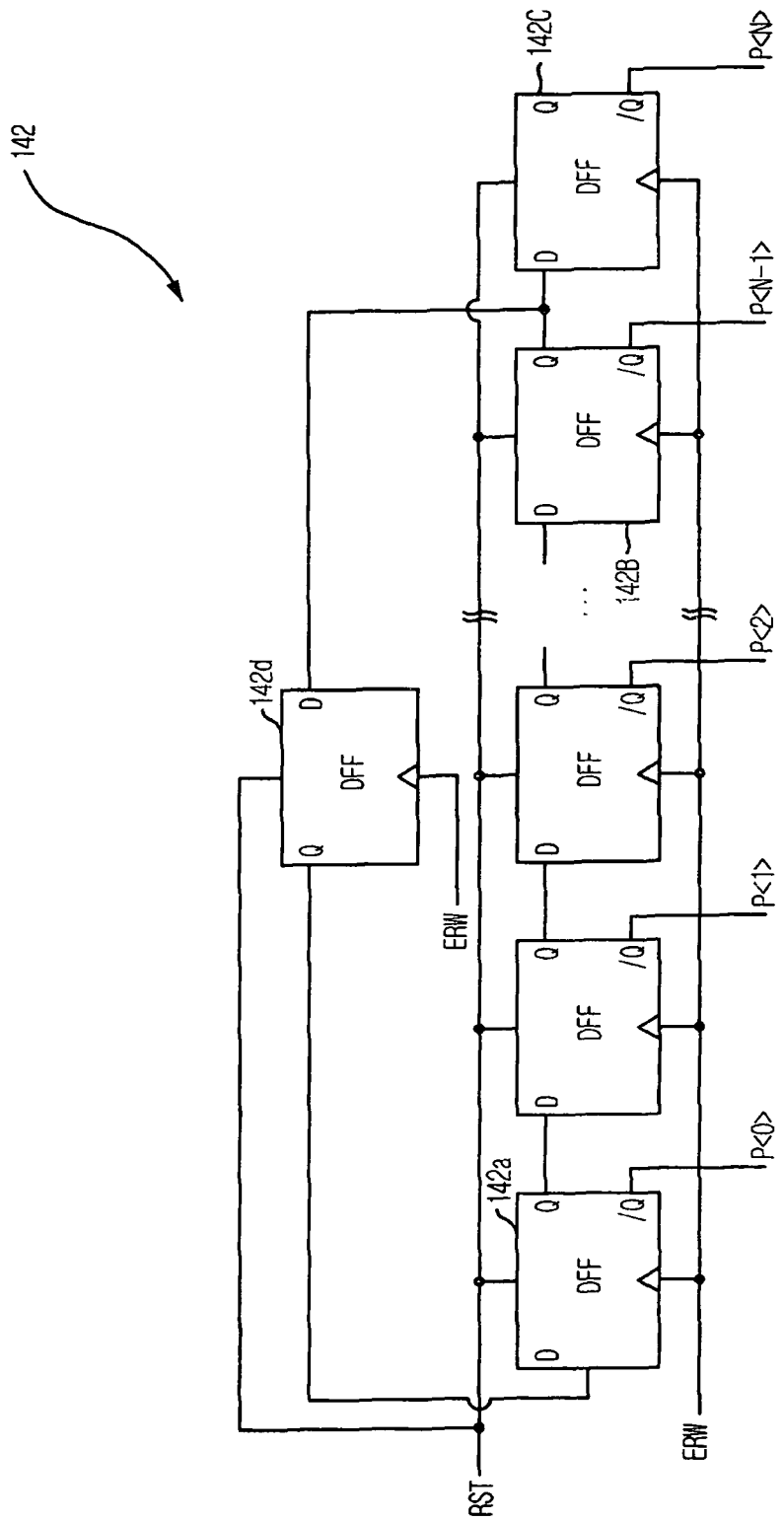
FIG. 9 is a block diagram of a PI shift unit shown in FIG. 5.

FIG. 9 is a block diagram of the PI shift unit 142 shown in FIG. 5.

The PI shift unit 142 includes a plurality of reset flip-flops, e.g., 142a, and one set flip-flop 142d. The reset flip-flops are serially connected one another and output the PI delay signals P<0:N>. Each reset flip-flop, e.g., 142a, transmits an input signal input through an input terminal D to the next reset flip-flop through a first output terminal Q in synchronism with the PI drive signal ERW. A second output of each reset flip-flop, e.g., 142a, is output through a second output terminal /Q as the PI delay signal, e.g., P<0>. A first output of a reset flip-flop 142b is transmitted to an input terminal D of the last flip-flop 142c and an input terminal D of the set flip-flop 142d. A first output of the set flip-flop 142d is output to the first reset flip-flop 142a through an input terminal D thereof. The reset flip-flops reset the first and the second outputs thereof in response to the reset signal RST. The set flip-flop 142d sets the first and the second outputs thereof in response to the reset signal RST.

Figure 10:
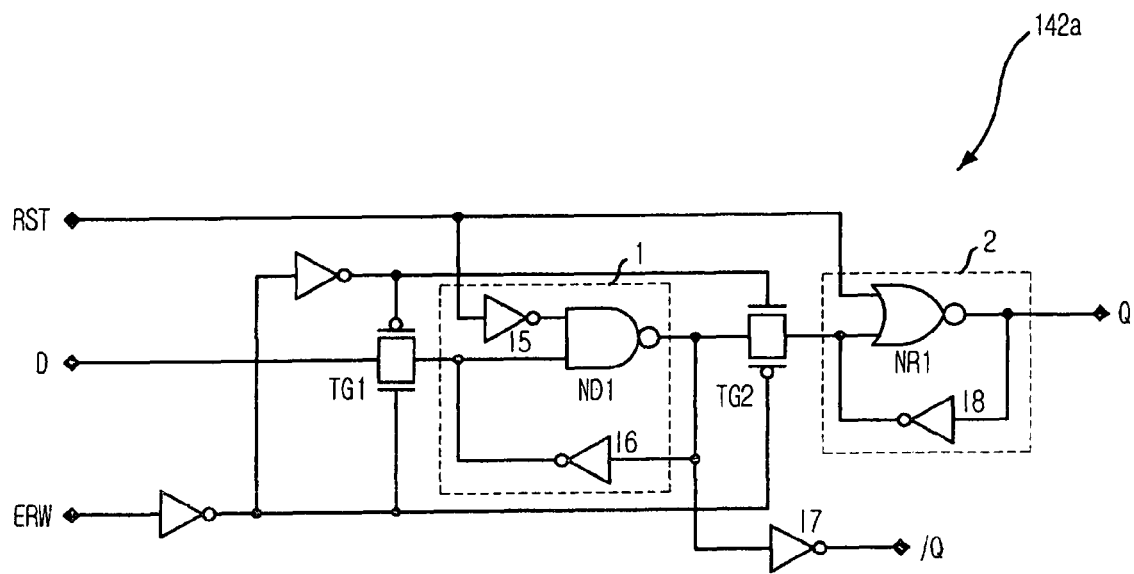
FIG. 10 is an internal circuit diagram of a reset flip-flop shown in FIG. 9.

FIG. 10 is an internal circuit diagram of the reset flip-flop shown in FIG. 9.

The reset flip-flop includes two transmission gates TG1 and TG2, two latches 1 and 2, and a seventh inverter I7. The first transmission gate TG1 transmits an input signal input through the input terminal D in response to the PI drive signal ERW of a logic low level. The first latch 1 latches an output of the first transmission gate TG1. The first latch 1 outputs an output of a logic high level when the reset signal RST is active. When the reset signal RST is inactive, the first latch 1 latches and outputs the output of the first transmission gate TG1. The seventh inverter I7 inverts an output of the first latch 1 and outputs the PI delay signal P<0:N> through the second terminal /Q. The second transmission gate TG2 transmits the output of the first latch 1 in response to the PI drive signal ERW of a logic high level. The second latch 2 outputs an output of a logic low level when the reset signal RST is active. When the reset signal RST is inactive, the second latch 2 latches and outputs an output of the second transmission gate TG2 through the first output terminal Q.

The first latch 1 includes two inverters I5 and I6 and a first NAND gate ND1. The fifth inverter I5 inverts the reset signal RST. The first NAND gate ND1 logically combines an output of the fifth inverter I5 and the output of the first transmission gate TG1. The sixth inverter I6 inverts an output of the first NAND gate ND1. An output terminal of the sixth inverter I6 is connected to an output terminal of the first transmission gate TG1. The second latch 2 includes a first NOR gate NR1 and an eighth inverter I8. The first NOR gate NR1 logically combines the reset signal RST and an output of the second transmission gate TG2. The eighth inverter I8 inverts an output of the first NOR gate NR1. An output terminal of the eighth inverter I8 is connected to an output terminal of the second transmission gate TG2.

The reset flip-flop shown in FIG. 10 resets the first and the second outputs respectively output through the first and the second output terminals Q and /Q as a logic low level when the reset signal RST is active. When the reset signal RST is inactive, the reset flip-flop outputs the input signal input through the input terminal D as the PI delay signal P<0:N> through the second input terminal /Q when the PI drive signal ERW has a logic low level. When the reset signal RST is inactive and the PI drive signal ERW has a logic high level, the reset flip-flop outputs the input signal through the first output terminal Q.

Figure 11:
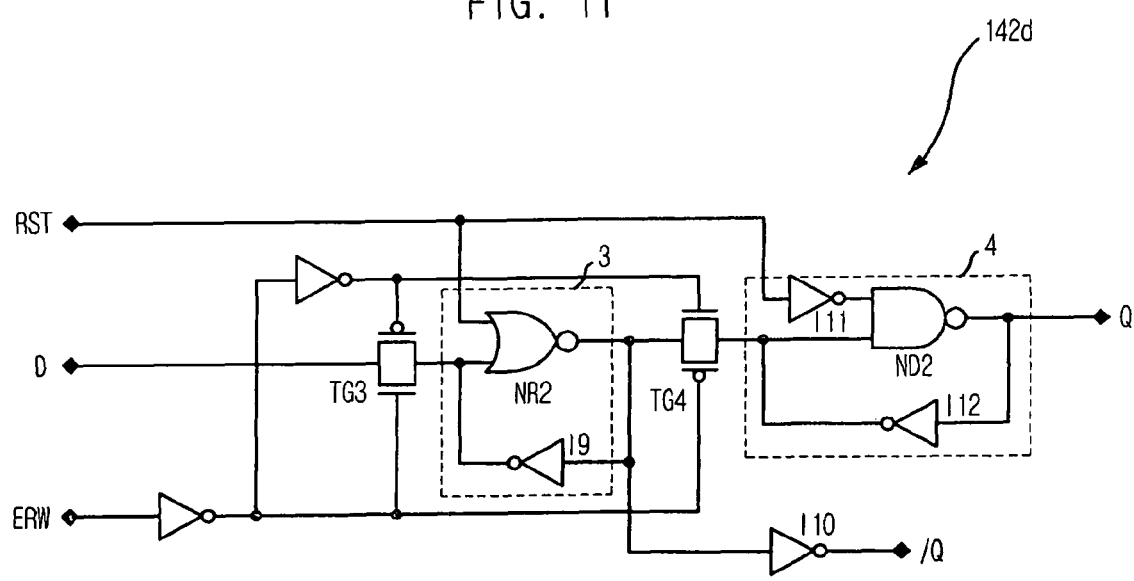
FIG. 11 is an internal circuit diagram of a set flip-flop shown in FIG. 9.

FIG. 11 is an internal circuit diagram of the set flip-flop shown in FIG. 9.

The set flip-flop includes two transmission gate TG3 and TG4, two latches 3 and 4, and a tenth inverter I10. The third transmission gate TG3 transmits an input signal input through an input terminal D when the PI drive signal ERW has a logic low level. The third latch 3 outputs an output of logic low level when the reset signal RST is active. When the reset signal RST is inactive, the third latch 3 latches and outputs an output of the third transmission gate TG3. The tenth inverter I10 inverts an output of the third latch 3. An output of the tenth inverter I10 is output through a second output terminal /Q. The fourth transmission gate TG4 transmits the output of the third latch 3 in response to the PI drive signal of a logic high level. The fourth latch 4 outputs an output signal of a logic high level when the reset signal RST is active. When the reset signal RST is inactive, the fourth latch 4 latches and an output of the fourth transmission gate TG4 through a first output terminal Q.

The third latch 3 includes a second NOR gate NR2 and a ninth inverter I9. The second NOR gate NR2 logically combines the reset signal RST and the output of the third transmission gate TG3. The ninth inverter I9 inverts an output of the second NOR gate NR2. An output terminal of the ninth inverter I9 connected to an output terminal of the third transmission gate TG3. The fourth latch 4 includes a second NAND gate ND2 and two inverters I11 and I12. The eleventh inverter I11 inverts the reset signal RST. The second NAND gate ND2 logically combines an output of the eleventh inverter I11 and the output of the fourth transmission gate TG4. The twelfth inverter I12 inverts an output of the fourth transmission gate TG4. An output terminal of the twelfth inverter I12 is connected to an output terminal of the fourth transmission gate TG4.

The set flip-flop shown in FIG. 11 sets a first and a second output respectively output through the first and the second output terminals Q and /Q as a logic high level when the reset signal RST is active. When the reset signal RST is inactive, the set flip-flop outputs the input signal input through the input terminal D through the second output terminal /Q when the PI drive signal ERW has a logic low level. When the reset signal RST is inactive and the PI drive signal ERW has a logic high level, the set flip-flop outputs the input signal through the first output terminal Q.

Figure 12:
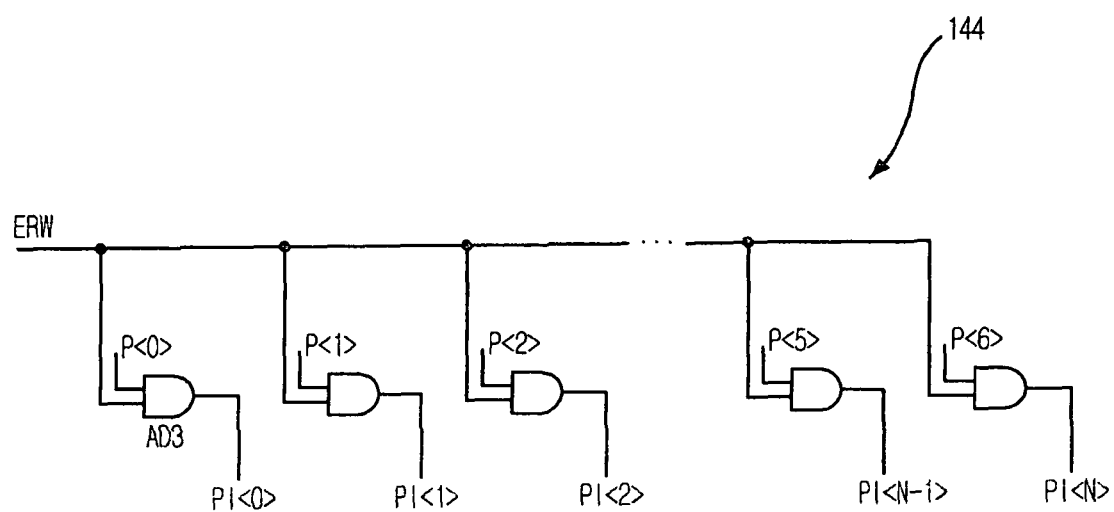
FIG. 12 is an internal circuit diagram of a PI drive unit shown in FIG. 5.

FIG. 12 is an internal circuit diagram of the PI drive unit 144 shown in FIG. 5.

The PI drive unit 144 includes a plurality of drivers. Each driver receives a corresponding PI delay signal P<0:N> and logically combines the corresponding PI delay signal P<0:N> and the PI drive enable signal ERW to output the pipe in signal PI<0:N>. For example, the first driver receiving the first PI delay signal P<0> includes a third AND gate AD3. The third AND gate AD3 logically combines the first PI delay signal P<0> and the PI drive signal ERW and outputs the first pipe in signal PI<0>. The other drivers have similar structure with the first driver.

Figure 13:
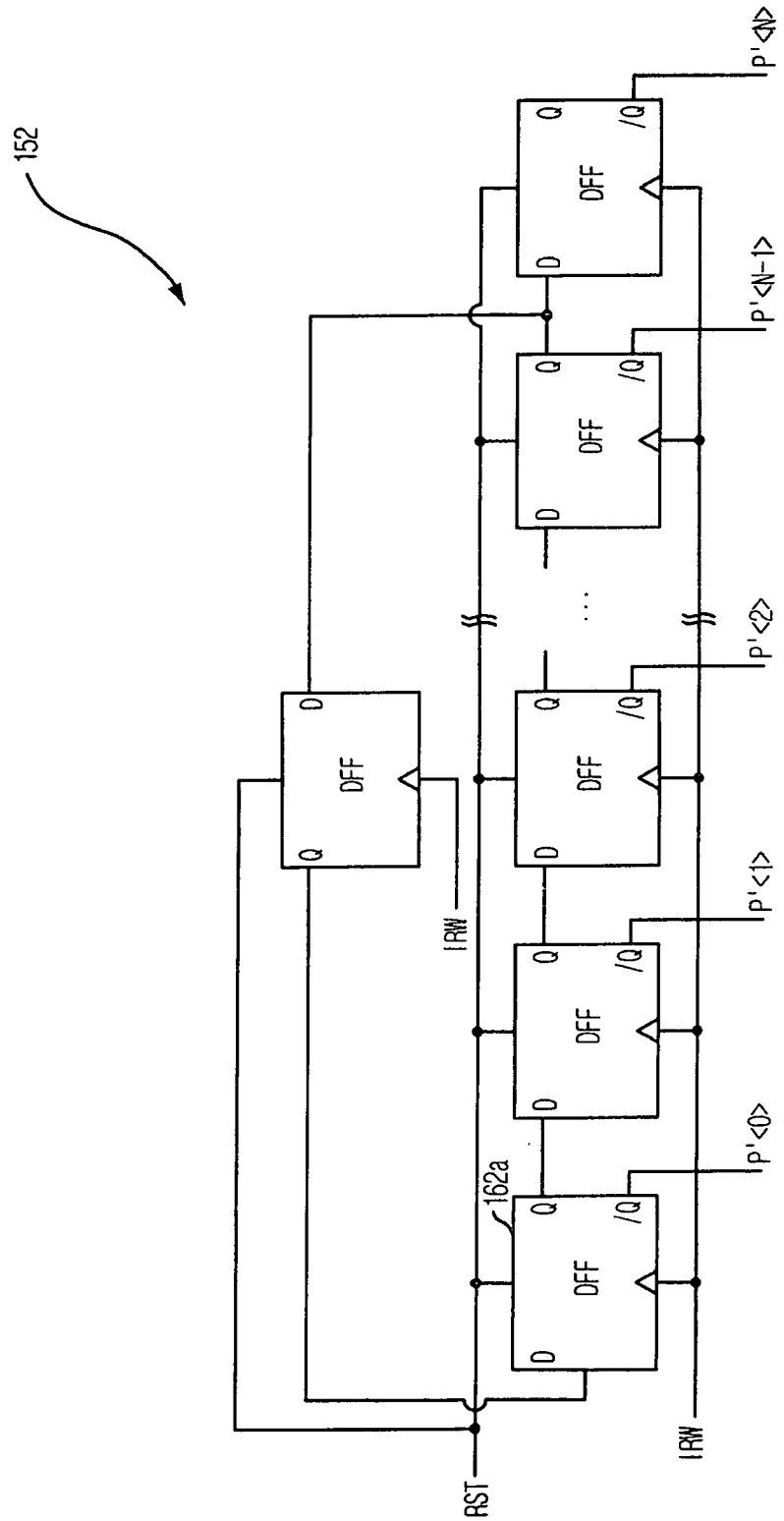
FIG. 13 is a block diagram of a PO shift unit shown in FIG. 5.

FIG. 13 is a block diagram of the PO shift unit 152 shown in FIG. 5.

The PO shift unit 152 has circuitry similar to the PI shift unit 142 shown in FIG. 9 except that each reset flip-flop and set flip-flop performs an operation in synchronism with the PO drive signal IRW. The reset flip-flops and the set flip-flop have circuitry similar to the reset flip-flops and the set flip-flop respectively shown in FIGS. 10 and 11.

Figure 14:
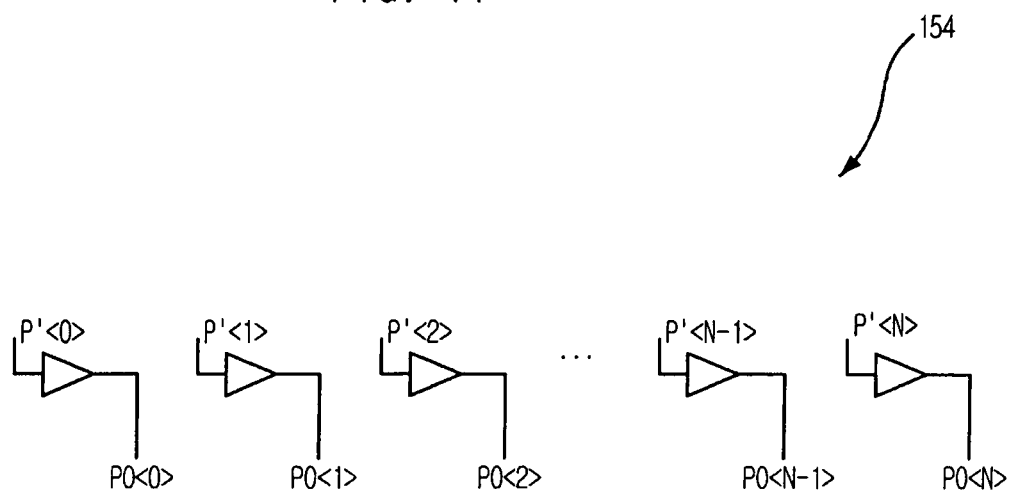
FIG. 14 is an internal circuit diagram of a PO drive unit shown in FIG. 5.

FIG. 14 is an internal circuit diagram of the PO drive unit 154 shown in FIG. 5.

The PO drive unit 154 includes a plurality of buffers. Each buffer buffers a corresponding PO delay signal P'<0:N> output from the PO shift unit 152 and output as the pipe out signal PO<0:N>.

Figure 15:
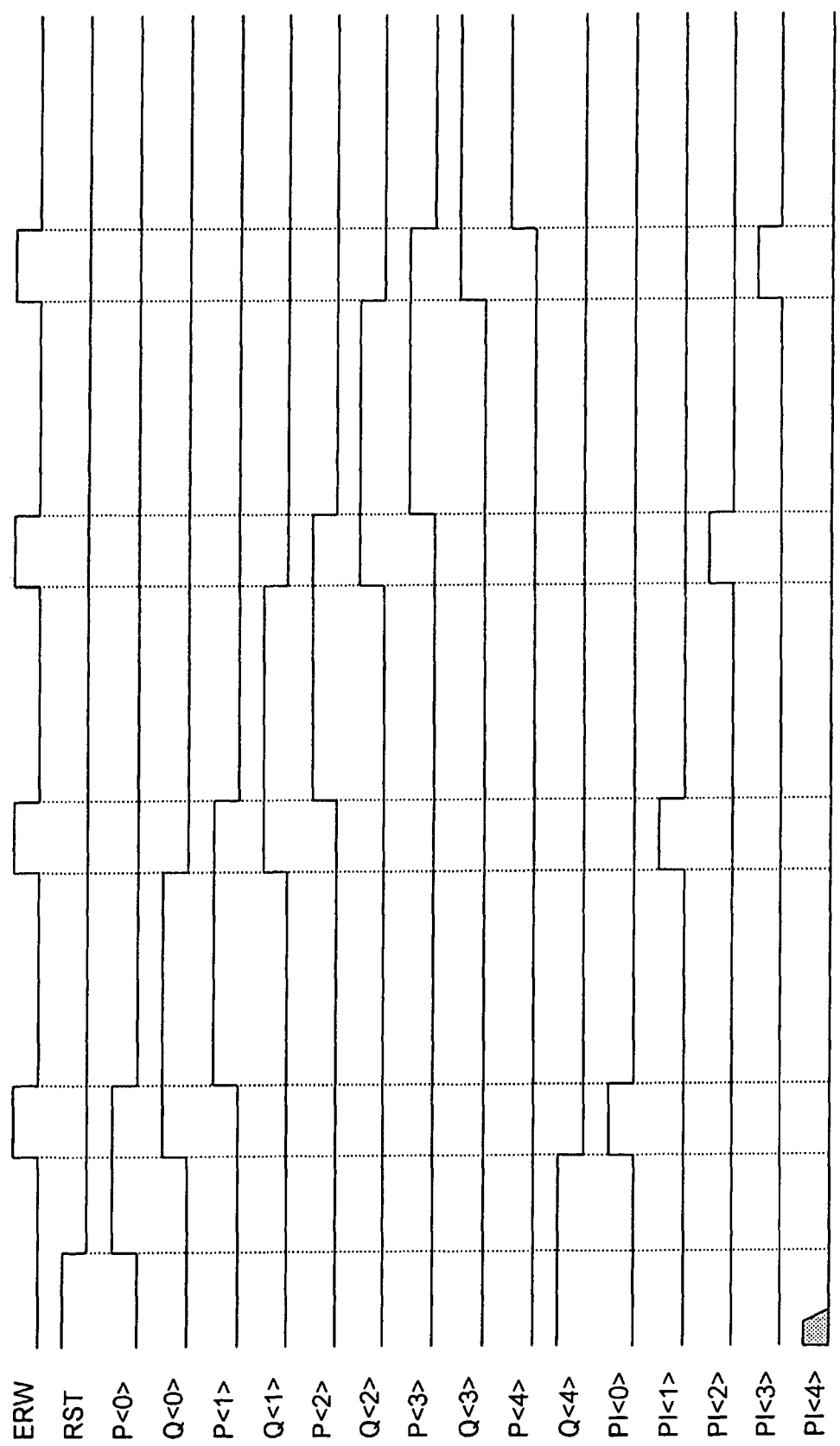
FIG. 15 is a waveform diagram for operation of a PI signal generation unit shown in FIG. 5.

FIG. 15 is a waveform diagram for operation of the PI signal generation unit 140 shown in FIG. 5.

When the reset signal RST is active, the reset flip-flops in the PI signal generation unit 140 reset their first and second outputs as the logic low level. The set flip-flop sets its first and second outputs as the logic high level.

When the reset signal RST is inactive, the first reset flip-flop 142a transmits an input signal from the set flip-flop 142d and outputs the first PI delay signal P<0> of a logic high level through the second output terminal /Q in response to the PI drive signal ERW of the logic low level. When the PI drive signal ERW has the logic high level, the first reset flip-flop 142a outputs the first output of logic high level through the first output terminal Q. Then, when the PI drive signal ERW has the logic low level, the second reset flip-flop transmits an input signal input through an input terminal D, i.e., the first output of the first reset flip-flop 142a, and outputs the second PI delay signal P<1> through the second output terminal /Q. When the PI drive signal ERW has the logic high level, the second reset flip-flop outputs the first output of a logic high level. As above described, the PI shift unit 142 sequentially enables the PI delay signals P<0:N> in response to an inactivation of the PI drive signal ERW. The drivers in the PI drive unit 144 output the PI delay signals P<0:N> as the pipe in signal PI<0:N> during an activation of the PI drive signal ERW. Therefore, the pipe in signal PI<0:N> has the same pulse width as the PI drive signal ERW.

Figure 16:
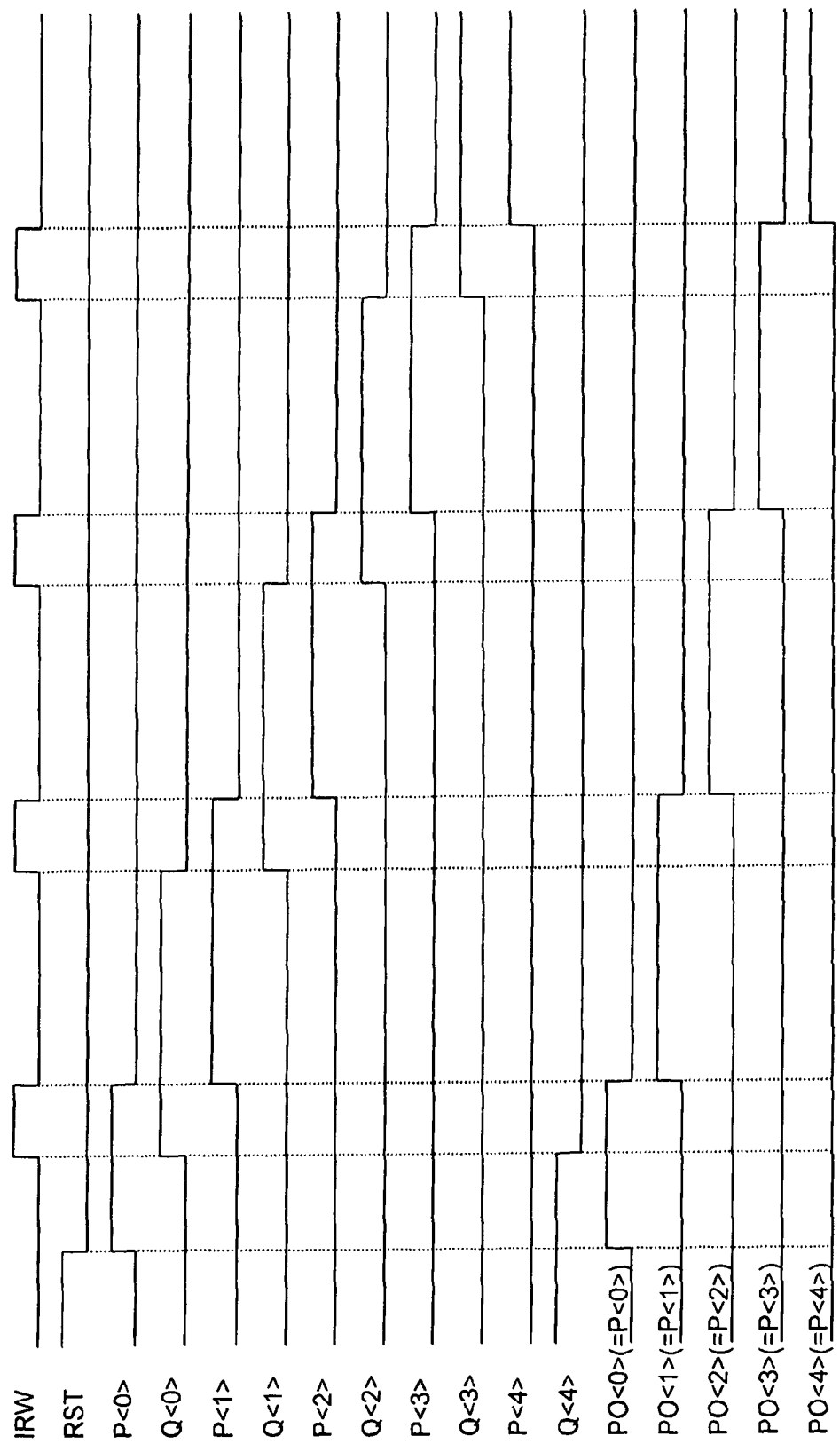
FIG. 16 is a waveform diagram for operation of a PO signal generation unit shown in FIG. 5.

FIG. 16 is a waveform diagram for operation of the PO signal generation unit 150 shown in FIG. 5.

When the reset signal RST is inactive, the first reset flip-flop transmits an input signal from the set flip-flop and outputs the first PO delay signal of a logic high level through the second output terminal /Q in response to the PO drive signal IRW of the logic low level. When the PO drive signal IRW has the logic high level, the first reset flip-flop outputs the first output of logic high level through the first output terminal Q. Then, when the PO drive signal IRW has the logic low level, the second reset flip-flop transmits an input signal input through an input terminal D, i.e., the first output of the first reset flip-flop, and outputs the second PO delay signal through the second output terminal /Q. When the P0 drive signal IRW has the logic high level, the second reset flip-flop outputs the first output of a logic high level. As above described, the P0 shift unit 152 sequentially enables the P0 delay signals in response to an inactivation of the PO drive signal IRW. The drivers in the PO drive unit 154 output the PO delay signals as the pipe out signal PO<0:N>. The pipe output signal PO<0:N> has the same pulse width as the PO delay signal. That is, the pipe out signal PO<0:N> is active from an input timing of a corresponding internal command and until an input timing of the next internal command.

Figure 17:
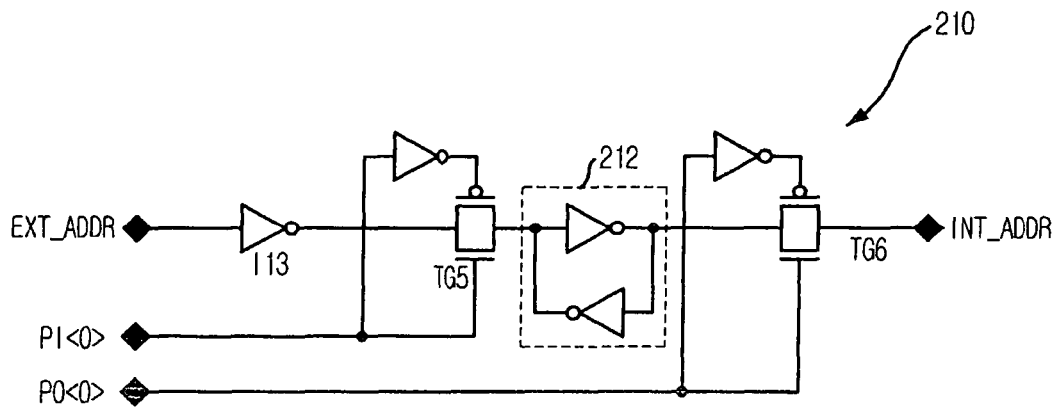
FIG. 17 is a schematic circuit diagram of a first pipe latch shown in FIG. 4.

FIG. 17 is a schematic circuit diagram of the first pipe latch 210 shown in FIG. 4.

The first pipe latch 210 includes a thirteenth inverter I13, two transmission gates TG5 and TG6, and a first latch unit 212. The thirteenth inverter I13 inverts the external address EXT_ADDR. The fifth transmission gate TG5 transmits an output of the thirteenth inverter I13 in response to the first pipe in signal PI<0> of a logic high level. The first latch unit 212 latches an output of the fifth transmission gate TG5. The sixth transmission gate TG6 transmits an output of the first latch unit 212 as the internal address INT_ADDR in response to the first pipe output signal PO<0> of a logic high level. That is, the first address latch unit 210 latches the external address EXT_ADDR in response to an activation of the first pipe in signal PI<0> and outputs the internal address INT_ADDR in response to activation of the first pipe out signal PO<0>. The other pipe latches included in the pipe latch unit 200 shown in FIG. 4 have the same structure shown in FIG. 17 and, accordingly, perform similar operation.

Figure 1:
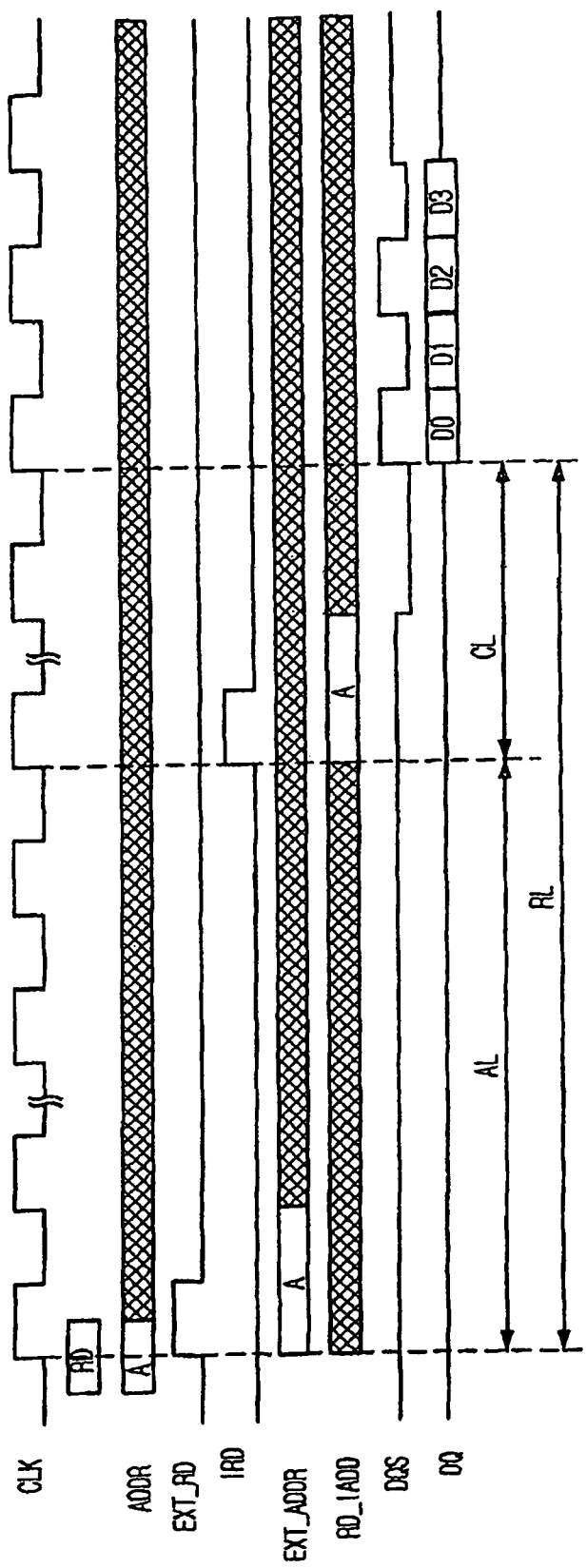
FIG. 1 is a timing diagram for a read operation of a semiconductor memory device.
Figure 2:
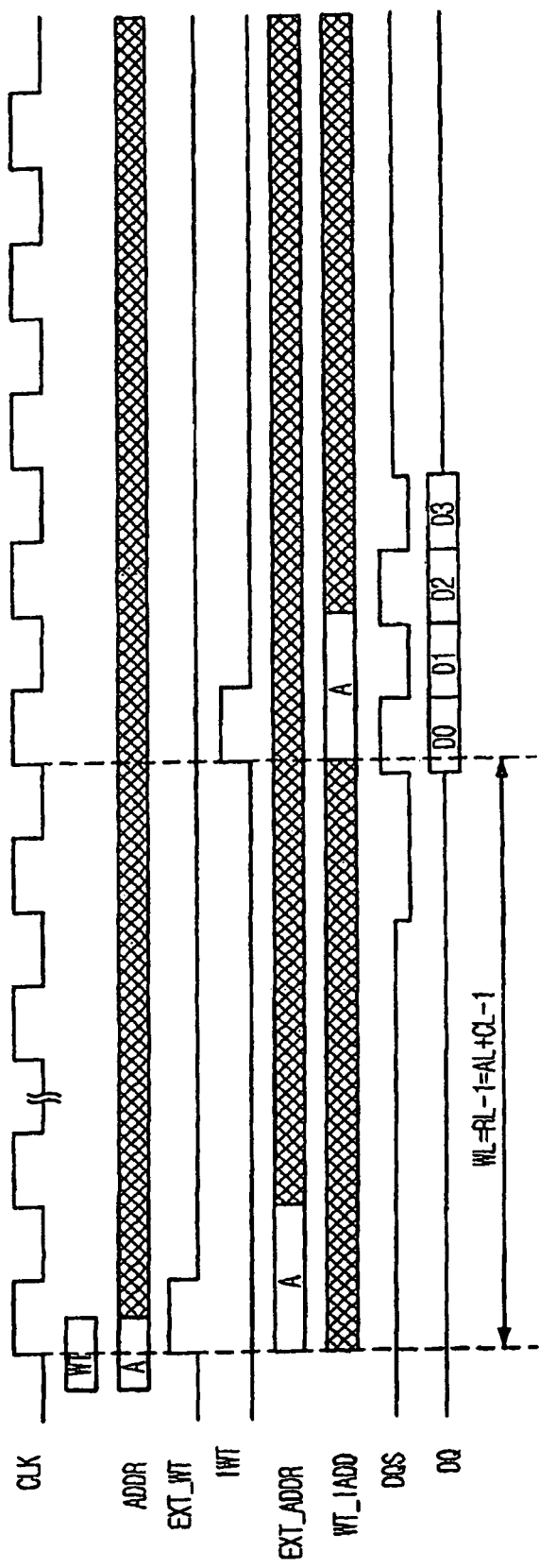
FIG. 2 is a timing diagram for a write operation of the semiconductor memory device.
Figure 3:
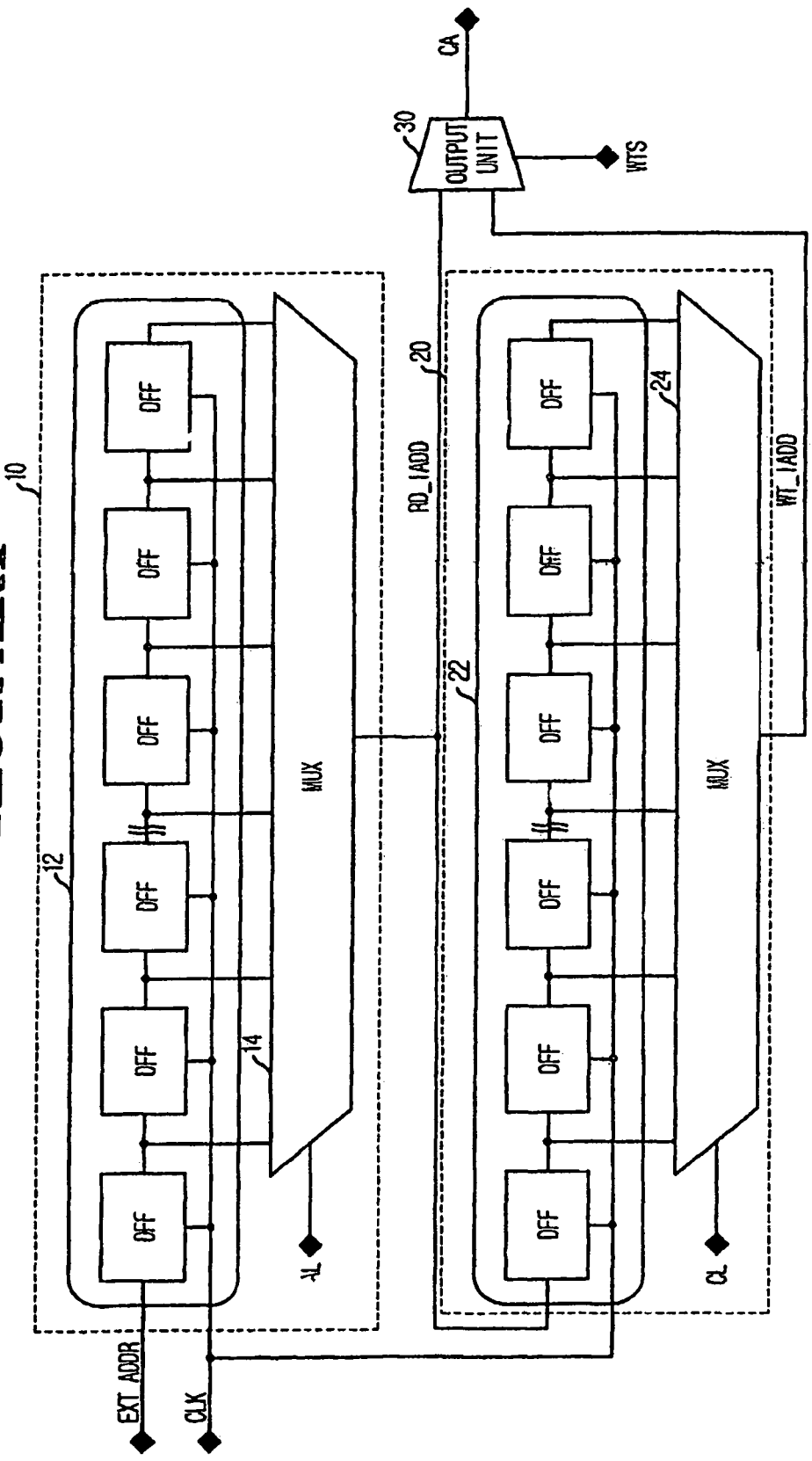
FIG. 3 is a block diagram of a conventional internal signal generator for use in a semiconductor memory device.

The internal signal generator of the present invention includes a plurality of the pipe latches, e.g., 210. Therefore, each bit of the external address EXT_ADDR is latched in different pipe latches. The number of pipe latches included in the pipe latch unit 200 is determined by the write latency WL and a CAS to CAS delay (hereinafter referred to as tCCD) of the semiconductor memory device. Namely, the number of the pipe latches is WL/tCCD. The tCCD means the minimum time between input timings of two external commands which are continuously input. In other words, the internal signal generator includes the pipe latches as many as the external addresses EXT_ADDR input during the maximum latency required to perform an operation according to one external command EXT_ADDR. For example, the tCCD of a DDR2 SDRAM is two clocks. When the maximum additive latency is six clocks and the maximum CAS latency is seven clocks, the maximum write latency WL of the DDR2 SDRM is thirteen clocks. In this case, the DDR2 SDRAM includes seven numbers of pipe latches. Comparing with the conventional device shown in FIG. 3, the internal signal generator shown in FIG. 4 includes the same number of flip-flops when the maximum additive latency and the maximum CAS latency is the same and, therefore, the present invention is possible to reduce a chip size.

Figure 18:
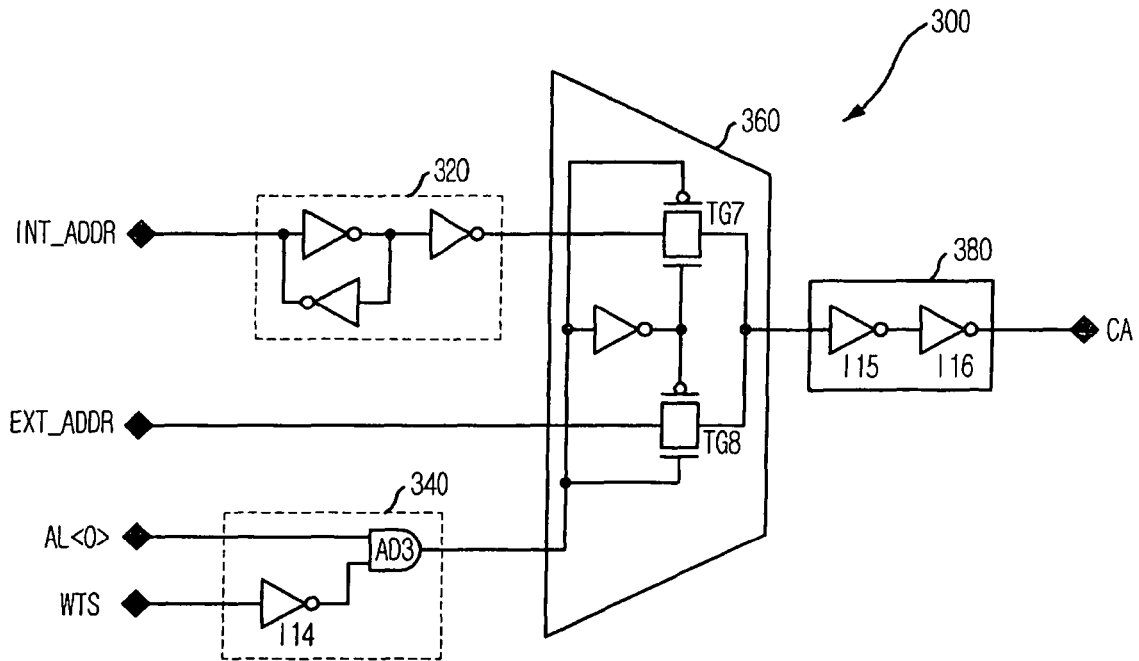
FIG. 18 is a schematic circuit diagram of an output drive unit shown in FIG. 4.

FIG. 18 is a schematic circuit diagram of the output drive unit 300 shown in FIG. 4.

The output drive unit 300 includes a second latch unit 320, a selection signal generation unit 340, a selection unit 360, and an output driver 380. The second latch unit 320 latches the internal address INT_ADDR. The selection signal generation unit 340 generates a selection signal based on the zero additive latency signal AL<0> and the write state signal WTS. The selection unit 360 selects one of the internal address INT_ADDR. latched in the second latch unit 320 and the external address EXT_ADDR in response to the selection signal. The output driver 380 outputs an output signal of the selection unit as the column address CA. The selection signal generation unit 340 includes a fourteenth inverter I14 for inverting the write state signal WTS and a third AND gate AD3 logically combines an output of the fourteenth inverter I14 and the zero additive latency signal AL<0>. The selection unit 360 includes two transmission gates TG7 and TG8.

The seventh transmission gate TG7 transmits the internal address INT_ADDR. when the selection signal is the logic low level. The eighth transmission gate TG8 transmits the external address EXT_ADDR when the selection signal is the logic high level. The output driver 380 includes two inverters I15 and I16 serially connected to each other.

The selection signal generation unit 340 outputs the selection signal of a logic high level when the zero additive latency signal AL<0> is active and the write state signal WTS is inactive. Otherwise, the selection signal has a logic low level. The selection unit 360 selects the external address EXT_ADDR when the selection signal is the logic high level. When the selection signal has the logic low level, the selection unit 360 selects the internal address INT_ADDR latches in the second latch unit 320. Namely, the output drive unit 300 outputs the external address EXT_ADDR as the column address CA when the additive latency of the semiconductor memory device is zero clocks and the semiconductor memory device performs the read operation. Otherwise, the output driver outputs the internal address INT_ADDR as the column address.

As above described, the present invention latches the external address EXT_ADDR during a predetermined latency in stead of shifting the external address EXT_ADDR in order to output the internal address INT_ADDR. That is, the present invention latches the external address EXT_ADDR, input with the external read command or the external write command, and outputs the latched external address EXT_ADDR as the internal address INT_ADDR in response to an activation of the internal read command or the internal write command. As a result, the present invention reduces the number of flip-flops and, accordingly, it is possible to reduce the current consumption.

The present application contains subject matter related to Korean patent application No. 2005-090891 and No. 2005-134002, filed in the Korean Patent Office on Sep. 29, 2005 and on Dec. 29, 2005, respectively, the entire contents of which are incorporated herein by references.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
a pipe latch control unit configured to sequentially enable a pipe in (PI) signal in response to an external command and to sequentially enable a pipe out (PO) signal in response to an internal command;
a pipe latch unit including a plurality of pipe latches, each of which latches an external address in response to the PI signal and outputs a latched external address as an internal address in response to the PO signal; and
an output drive unit configured to receive the internal address outputted from the pipe latch unit and the external address, and to selectively output the internal address or the external address as a column address CA, wherein the external address is outputted when a write operation is not being performed by the semiconductor device and the additive latency is zero, and the internal address is outputted otherwise,
wherein the internal command is activated after a predetermined latency from an activation of a corresponding external command.

2. The semiconductor memory device as recited in claim 1, wherein the external command includes an external read command and an external write command and the internal command includes an internal read command and an internal write command.

3. The semiconductor memory device as recited in claim 2, wherein the output drive unit includes:

a latch unit configured to latch the internal address;

a selection signal generation unit configured to generate a selection signal of a first logic level when an additive latency of the semiconductor memory device is set to zero clocks and the semiconductor memory device performs a write operation, and to produce the selection signal of a second logic level otherwise;

a selection unit configured to output the external address in response to the selection signal of the first logic level and to output the internal address in response to the selection signal of the second logic level; and an output driver configured to output an output of the selection unit as an internal column address.

4. The semiconductor memory device as recited in claim 3, wherein the selection signal generation unit outputs the selection signal of the first logic level when a zero additive latency signal is activated and a write state signal is inactivated.

5. The semiconductor memory device as recited in claim 4, wherein the selection signal generation unit includes:
a first inverter for inverting the write state signal; and
a first NAND gate for logically combining an output of the first inverter and the zero additive latency signal.

6. The semiconductor memory device as recited in claim 5, wherein the selection unit includes:
a first transmission gate for transmitting the external address in response to the selection signal of the first logic level; and
a second transmission gate for transmitting the internal address in response to the selection signal of the second logic level.

7. The semiconductor memory device as recited in claim 6, wherein the output driver includes an even number of inverters connected in series to each other.

8. The semiconductor memory device as recited in claim 7, wherein each of the pipe latches includes:
a first inverter for inverting the external address;
a first transmission gate for transmitting an output of the first inverter in response to the activation of a corresponding pipe-in signal;
a first latch unit for latching an output of the first transmission gate; and
a second transmission gate for transmitting an output of the first latch unit as the internal address in response to the activation of a corresponding pipe-out signal.

9. The semiconductor memory device as recited in claim 2, wherein each of the pipe latches includes:
a first inverter for inverting the external address;
a first transmission gate for transmitting an output of the first inverter in response to the activation of a corresponding pipe-in signal;
a first latch unit for latching an output of the first transmission gate; and
a second transmission gate for transmitting an output of the first latch unit as the internal address in response to the activation of a corresponding pipe-out signal.

10. The semiconductor memory device as recited in claim 9, wherein the pipe latch control unit includes:
a pipe-in (PI) drive signal generation unit configured to generate a PI drive signal in response to the activation of the external command;
a pipe-out (PO) drive signal generation unit configured to generate a PO drive signal in response to the activation of the internal command;
a PI signal generation unit configured to generate a plurality of PI signals in response to the PI drive signal;
a PO signal generation unit configured to generate a plurality of PO signals in response to the PO drive signal; and
an initialization unit configured to generate a reset signal for initializing the PI signal generation unit and the PO signal generation unit during an initial operation period or when the semiconductor memory device performs a read operation without an additive latency.

11. The semiconductor memory device as recited in claim 10, wherein the PI drive signal generation unit includes a first OR gate logically combining the external read command and the external write command.

12. The semiconductor memory device as recited in claim 11, wherein the PO drive signal generation unit includes a second OR gate logically combining the internal read command and the internal write command.

13. The semiconductor memory device as recited in claim 12, wherein the initialization unit outputs the reset signal when an initial reset signal is activated or when a zero additive latency signal is active and a write state signal is inactivated.

14. The semiconductor memory device as recited in claim 13, wherein the initialization unit includes an even number of inverters connected in series to each other receiving the initial reset signal as an input and outputting the reset signal.

15. The semiconductor memory device as recited in claim 13, wherein the initialization unit includes:
a second inverter for inverting the write state signal;
an AND gate for logically combining an output of the second inverter and the zero additive latency signal; and
a third OR gate for logically combining an output of the AND gate and the initial reset signal to output the reset signal.

16. The semiconductor memory device as recited in claim 13, wherein the initialization unit includes:
a second inverter for inverting the write state signal;
an AND gate for logically combining an output of the second inverter, the zero additive latency signal, and a test mode signal which is activated during a test mode operation; and
a third OR gate for logically combining an output of the AND gate and the initial reset signal to output the reset signal.

17. The semiconductor memory device as recited in claim 12, wherein the PI signal generation unit includes:
a PI shift unit configured to output a plurality of PI delay signals sequentially enabled in response to the PI drive signal; and
a PI drive unit configured to output the PI delay signals as the PI signals in response to the PI drive signal.

18. The semiconductor memory device as recited in claim 17, wherein the PO signal generation unit includes:
a PO shift unit configured to output a plurality of PO delay signals sequentially enabled in response to the PO drive signal; and
a PO drive unit configured to output the PO delay signals as the PO signals in response to the PO drive signal.

19. The semiconductor memory device as recited in claim 18, wherein the PI shift unit includes:
a plurality of reset flip-flops serially connected to one another, each of which outputs a corresponding PI delay signal through its second output terminal in response to the PI drive signal; and
a set flip-flop receiving a first output of the reset flip-flop which is located at second from the last among the plurality of reset flip-flops through its input terminal and providing its first output to the first reset flip-flop among the plurality of reset flip-flops, wherein the reset flip-flops reset their first and second outputs as a second logic level in response to the activation of the reset signal and the set flip-flop sets its first and second outputs as a first logic level in response to the activation of the reset signal.

20. The semiconductor memory device as recited in claim 19, wherein each of the reset flip-flops transmits an input signal through its second output terminal in response to the PI drive signal of the second logic level and transmits the input signal through its first output terminal in response to the PI drive signal of the first logic level when the reset signal is inactivated.

21. The semiconductor memory device as recited in claim 20, wherein the set flip-flop transmits an input signal through its second output terminal in response to the PI drive signal of the second logic level and transmits the input signal through its first output terminal in response to the PI drive signal of the first logic level.

22. The semiconductor memory device as recited in claim 21, wherein each of the reset flip-flops includes:
a third transmission gate for transmitting the input signal in response to the PI drive signal of the second logic level;
a second latch unit for latching an output of the third transmission gate when the reset signal is inactivated;
a second inverter for inverting and outputting an output of the second latch unit through the second output terminal;
a fourth transmission gate for transmitting the output of the second latch unit in response to the PI drive signal of the first logic level; and
a third latch unit for latching an output of the fourth transmission gate and outputting the latched signal as the second output when the reset signal is inactivated.

23. The semiconductor memory device as recited in claim 22, wherein the set flip-flop includes:
a fifth transmission gate for transmitting the input signal in response to the PI drive signal of the second logic level;
a fourth latch unit for latching an output of the fifth transmission gate when the reset signal is inactive;
a third inverter for inverting and outputting an output of the fourth latch unit through the second terminal;
a sixth transmission gate for transmitting the output of the fourth latch unit in response to the PI drive signal of the first logic level; and
a fifth latch unit for latching and outputting an output of the sixth transmission gate when the reset signal is inactivated.

24. The semiconductor memory device as recited in claim 23, wherein the second latch unit includes:
a fourth inverter for inverting the reset signal;
a first NAND gate for logically combining an output of the fourth inverter and the output of the third transmission gate; and
a fifth inverter for inverting an output of the first NAND gate, wherein an output terminal of the fifth inverter is connected to an output terminal of the third transmission gate.

25. The semiconductor memory device as recited in claim 24, wherein the third latch unit includes:
a first NOR gate for logically combining the reset signal and the output of the fourth transmission gate; and
a sixth inverter for inverting an output of the first NOR gate, wherein an output terminal of the sixth inverter is connected to an output terminal of the fourth transmission gate.

26. The semiconductor memory device as recited in claim 25, wherein the fourth latch unit includes:

a second NOR gate for logically combining the reset signal and the output of the fifth transmission gate; and
a seventh inverter for inverting an output of the second NOR gate, wherein an output terminal of the seventh inverter is connected to an output terminal of the fifth transmission gate.

27. The semiconductor memory device as recited in claim 26, wherein the fifth latch unit includes:
an eighth inverter for inverting the reset signal;
a second NAND gate for logically combining an output of the eighth inverter and the output of the sixth transmission gate; and
a ninth inverter for inverting an output of the second NAND gate, wherein an output terminal of the ninth inverter is connected to an output terminal of the sixth transmission gate.

28. The semiconductor memory device as recited in claim 27, wherein the PO shift unit includes:
a plurality of reset flip-flops serially connected to one another, each of which outputs a corresponding PO delay signal through its second output terminal in response to the PO drive signal; and
a set flip-flop receiving a first output of the reset flip-flop which is located at second from the last among the plurality of reset flip-flops through its input terminal and inputting its first output to the first reset flip-flop among the plurality of reset flip-flops,
wherein the reset flip-flops reset their first and second outputs as the second logic level in response to the activation of the reset signal and the set flip-flop sets its first and second outputs as the first logic level in response to the activation of the reset signal.

29. The semiconductor memory device as recited in claim 28, wherein each of the reset flip-flops in the PO shift unit transmits an input signal through its second output terminal in response to the PO drive signal of the second logic level and transmits the input signal through its first output terminal in response to the PO drive signal of the first logic level when the reset signal is inactivated.

30. The semiconductor memory device as recited in claim 29, wherein the set flip-flop in the PO shift unit transmits an input signal through its second output terminal in response to the PO drive signal of the second logic level and transmits the input signal through its first output terminal in response to the PO drive signal of the first logic level.

31. A method for generating an internal address for use in a semiconductor memory device, comprising:
latching an external address in a pipe latch in response to the inputting of an external command and generating a latched external address;
generating an internal command by delaying the external command according to a predetermined latency;
outputting the latched external address as the internal address in response to the activation of the internal command; and
selecting one of the external address and the internal address as a column address, wherein the external address is outputted when a write operation is not being performed by the semiconductor device and the additive latency is zero, and the internal address is outputted otherwise.

32. The method as recited in claim 31, wherein the latency includes an additive latency and a column address strobe (CAS) latency.

33. The method as recited in claim 32, wherein latching the external address includes:

generating a pipe in (PI) drive signal in response to the inputting of the external command;

generating a plurality of PI delay signals in response to the PI drive signal;

generating a plurality of PI signals by logically combining the PI drive signal and the PI delay signals; and latching the external address in the pipe latch in response to the activation of a corresponding PI signal among the PI signals.

34. The method as recited in claim 33, wherein outputting the internal address includes:

generating a pipe out (PO) drive signal in response to the activation of the internal command;

generating a plurality of PO delay signals in response to the PO drive signal;

generating a plurality of PO signals by buffering the PO delay signals; and outputting the internal address latched in the pipe latch in response to the activation of a corresponding PO signal among the PO signals.

* * * * *